United States Patent
Henke

(10) Patent No.: US 11,361,911 B2
(45) Date of Patent: Jun. 14, 2022

(54) SLIDING CONTACT ARC SUPPRESSION

(71) Applicant: Arc Suppression Technologies, Bloomington, MN (US)

(72) Inventor: Reinhold Henke, Alexandria, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

(21) Appl. No.: 16/986,694

(22) Filed: Aug. 6, 2020

(65) Prior Publication Data

US 2020/0365340 A1 Nov. 19, 2020

Related U.S. Application Data

(63) Continuation of application No. 16/776,347, filed on Jan. 29, 2020, now Pat. No. 10,826,248.

(Continued)

(51) Int. Cl.
*H01H 9/30* (2006.01)
*H01H 1/00* (2006.01)
(Continued)

(52) U.S. Cl.
CPC ....... *H01H 1/0015* (2013.01); *G01R 31/3272* (2013.01); *G01R 31/3277* (2013.01);
(Continued)

(58) Field of Classification Search
CPC .... H01H 1/0015; H01H 33/593; H01H 50/44; H01H 50/045; H01H 9/30; H01H 9/54;
(Continued)

(56) References Cited

U.S. PATENT DOCUMENTS

| 5,420,571 A | 5/1995 | Coleman et al. |
| 7,705,601 B2 | 4/2010 | Zhou |

(Continued)

FOREIGN PATENT DOCUMENTS

| CN | 113646977 A | 11/2021 |
| DE | 102011109920 A1 | 2/2013 |

(Continued)

OTHER PUBLICATIONS

"International Application Serial No. PCT/US2020/015730, International Preliminary Report on Patentability dated Apr. 12, 2021", 8 pgs.

(Continued)

*Primary Examiner* — Truc T Nguyen
(74) *Attorney, Agent, or Firm* — Schwegman Lundberg & Woessner, P.A.

(57) ABSTRACT

A sliding power contact and method includes a mobile load device connector and a socket. The mobile load device connector includes a non-current power pin having a first length, a current power pin having a second length less than the first length, a neutral pin, and a ground pin. The socket includes a non-current power contact configured to electrically couple with the non-current power pin, a current power contact configured to electrically couple with the current power pin, a neutral contact configured to electrically couple with the neutral pin, and a ground pin configured to electrically couple with the ground pin. An arc suppressor is directly coupled to at least one of the non-current power pin and the non-current power contact, wherein the arc suppressor, the non-current power pin and the non-current power contact form a current path between the current power pin and the current power contact.

20 Claims, 3 Drawing Sheets

Related U.S. Application Data

(60) Provisional application No. 62/798,323, filed on Jan. 29, 2019, provisional application No. 62/798,326, filed on Jan. 29, 2019, provisional application No. 62/798,316, filed on Jan. 29, 2019.

(51) Int. Cl.

| | | |
|---|---|---|
| *G01R 31/327* | (2006.01) | |
| *H01H 50/04* | (2006.01) | |
| *H01H 9/54* | (2006.01) | |
| *H01R 13/05* | (2006.01) | |
| *H01R 13/66* | (2006.01) | |
| *H01R 13/70* | (2006.01) | |
| *H01R 24/30* | (2011.01) | |
| *H02H 1/00* | (2006.01) | |
| *H02H 9/08* | (2006.01) | |
| *H01H 33/59* | (2006.01) | |
| *H01H 50/44* | (2006.01) | |

(52) U.S. Cl.
CPC ............... *H01H 9/30* (2013.01); *H01H 9/54* (2013.01); *H01H 33/593* (2013.01); *H01H 50/045* (2013.01); *H01H 50/44* (2013.01); *H01R 13/052* (2013.01); *H01R 13/6666* (2013.01); *H01R 13/70* (2013.01); *H01R 24/30* (2013.01); *H02H 1/0015* (2013.01); *H02H 9/08* (2013.01)

(58) Field of Classification Search
CPC .............. H01H 50/021; H01H 85/0082; H01H 2047/008; H01H 2085/0275; H01H 2085/0283; H01H 1/38; H01H 2009/543; H01H 9/542; G01R 31/3272; G01R 31/3277; H01R 13/052; H01R 13/6666; H01R 13/70; H01R 24/30; H01R 13/7038; H02H 1/0015; H02H 9/08
See application file for complete search history.

(56) References Cited

U.S. PATENT DOCUMENTS

| | | | | |
|---|---|---|---|---|
| 9,054,447 B1 * | 6/2015 | Czarnecki | ............. | H01R 13/53 |
| 9,537,265 B1 * | 1/2017 | Juds | ........................ | H01R 13/70 |
| 10,074,944 B2 * | 9/2018 | Bhatawadekar | ... | H01R 13/6633 |
| 10,826,248 B2 | 11/2020 | Henke | | |
| 2001/0031565 A1 * | 10/2001 | Sakiyama | ................. | H01T 1/06 |
| | | | | 439/38 |
| 2010/0153022 A1 | 6/2010 | Chen et al. | | |
| 2011/0222191 A1 | 9/2011 | Henke | | |
| 2012/0123698 A1 | 5/2012 | Chen et al. | | |
| 2013/0187389 A1 | 7/2013 | Thangamani et al. | | |
| 2014/0191589 A1 * | 7/2014 | Friebe | ............... | H01L 31/02021 |
| | | | | 307/130 |
| 2015/0188266 A1 * | 7/2015 | Chen | ...................... | H01R 43/26 |
| | | | | 439/620.21 |
| 2018/0034198 A1 | 2/2018 | Lyon et al. | | |
| 2020/0244015 A1 | 7/2020 | Henke | | |
| 2020/0373104 A1 * | 11/2020 | Stacom | .................. | H01H 33/12 |

FOREIGN PATENT DOCUMENTS

| | | |
|---|---|---|
| DE | 102012008614 A1 | 10/2013 |
| EP | 1638173 A2 | 3/2006 |
| FR | 2678781 A1 | 1/1993 |
| WO | 2020160185 | 8/2020 |

OTHER PUBLICATIONS

"U.S. Appl. No. 16/776,347, Non Final Office Action dated Apr. 15, 2020".
"U.S. Appl. No. 16/776,347, Notice of Allowance dated Jul. 1, 2020".
"U.S. Appl. No. 16/776,347, Response Filed Jun. 3, 2020 to Non-Final Office Action dated Apr. 15, 2020", 8 pgs.
"International Application Serial No. PCT/US2020/015730, International Search Report dated May 12, 2020", 5 pgs.
"International Application Serial No. PCT/US2020/015730, Written Opinion dated May 12, 2020", 8 pgs.
"U.S. Appl. No. 16/776,347, Notice of Allowance dated Aug. 24, 2020", 5 pgs.
"Application Serial No. PCT/US2020/015730, Response to Written Opinion and Amendment Under Article 34 Filed Nov. 25, 2020", 16 pgs.
"Application Serial No. PCT/US2020/015730, Written Opinion of the International Preliminary Examining Authority dated Jan. 15, 2021", 8 pgs.
U.S. Appl. No. 16/776,347, filed Jan. 29, 2020, Sliding contact arc suppression.

* cited by examiner

SLIDING CONTACT ARC SUPPRESSION

PRIORITY

This application is a continuation of U.S. patent application Ser. No. 16/776,347, filed Jan. 29, 2020, which application claims the benefit of priority to U.S. Provisional Application Ser. No. 62/798,316, filed Jan. 29, 2019; U.S. Provisional Application Ser. No. 62/798,323, filed Jan. 29, 2019; and U.S. Provisional Application Ser. No. 62/798,326, filed Jan. 29, 2019, the contents of all which are incorporated herein by reference in their entireties.

TECHNICAL FIELD

The present application relates generally to sliding power contact arc suppression.

BACKGROUND

Electrical current contact arcing may have a deleterious effects on electrical contact surfaces, such as of relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

BRIEF DESCRIPTION OF THE DRAWINGS

Some embodiments are illustrated by way of example and not limitation in the figures of the accompanying drawings.

DETAILED DESCRIPTION

Sliding power contacts include electronic components known in the art and can include any structure in which contacts slide with respect to one another rather than directly separating from one another, as in a switch. Such sliding power contacts may include, but are not limited to, components such as electrical cords, such as may be found in conventional appliances, power outlets, generators, charging stations, such as for electronic devices, electric vehicles, and the like, and any of a variety of examples of machinery the use of which involves frequent connections and disconnections. Such sliding power contacts may often include, a stationary socket, such as a jack, and a mobile load device connector, such as a plug that is coupled to or within the socket. As the mobile load device connector is coupled to the socket the electrical contacts slide with respect to one another, creating the conditions for arcing.

Arc suppressors can utilize contact separation detectors to detect a separation in the sliding contacts and/or a closing of the sliding contacts based on sudden changes in the voltage over the contacts. The contact separation detector may cause a contact bypass circuit to open in order to allow current to bypass the contacts during the transition period. However, transition period may not, and in many cases does not, include a simple and efficient voltage transition. Rather, a series of voltage bounces may occur as the electrical contacts open or close, causing small arcs or "arclets" to form. These arclets may damage the contacts even if a primary arc is suppressed.

Systems and methods have been developed to utilize arc suppressors to suppress arc formation at the earliest stages in sliding power contact and any related situation. For instance, in addition to sliding power contacts, the principles disclosed herein apply as well to circumstances in which differently-charged pieces of metal slide with respect to one another. For instance, the catenary wires, so-called third-rail systems as seen on subways and the like, and motor brushes all create circumstances in which contacts slide with respect to one another, and at the time of contact an arc may be created between the contacts.

Figure 1:
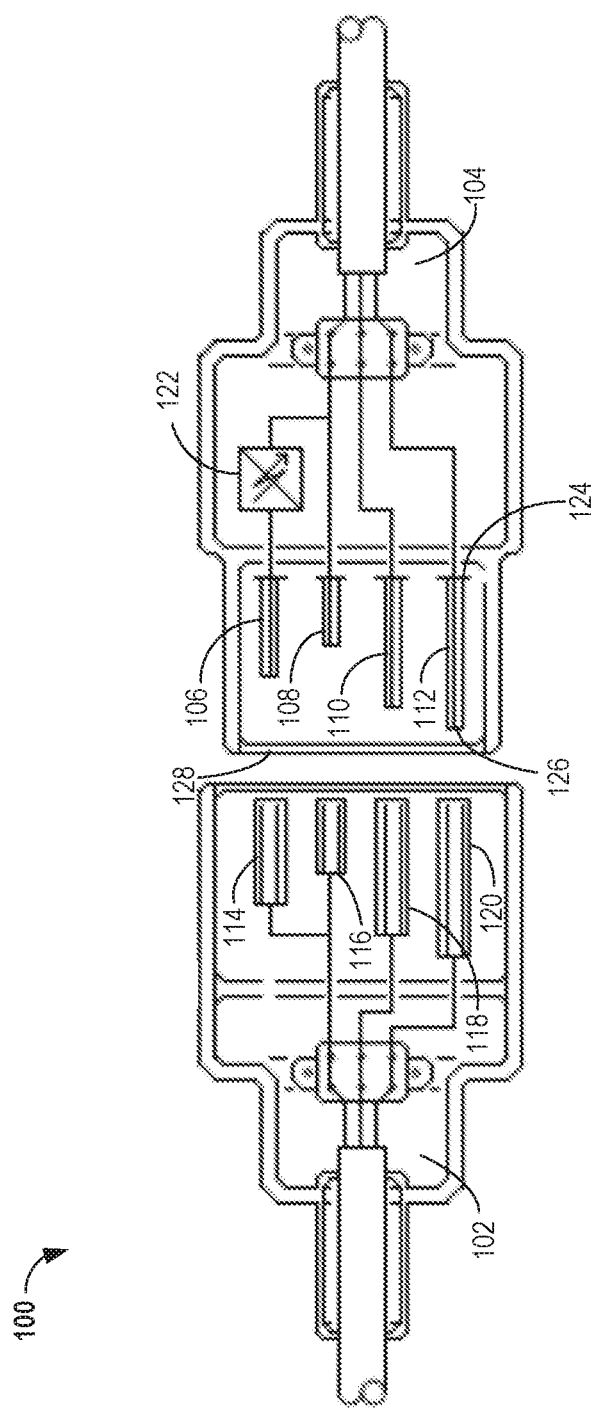
FIG. 1 is a diagram of a sliding power contact, in an example embodiment.

FIG. 1 is a diagram of a sliding power contact 100, in an example embodiment. The sliding power contact 100 includes a socket 102 and a mobile load device connector 104, such as a plug. The mobile load device connector 104 includes a non-current power pin 106 having a first length, a current power pin 108 having a second length, a neutral pin 110 having a third length, and a ground pin 112 having a fourth length. The socket 102 includes a non-current power contact 114 configured to engage and electrically couple with the non-current power pin 106, a current power contact 116 configured to engage and electrically couple with the current power pin 108, a neutral contact 118 configured to engage and electrically couple with the neutral pin 110, and a ground contact 120 configured to engage and electrically couple with the ground pin 112.

As depicted, the fourth length is longer than the first, second, and third lengths; the third length is longer than the first and second lengths; and the first length is longer than the second length. As a consequence, the mobile load device connector 104 is configured such that when the mobile load device connector 104 is inserted into the socket 102 the pins 106, 108, 110, 112 electrically couple with their respective contact 114, 116, 118, 120 in a predetermined sequence. In particular, the predetermined sequence may be that the ground pin 112 electrically couples to the ground contact 120 first, the neutral pin 110 electrically couples to the neutral contact 118 second, the non-current power pin 106 electrically couples to the non-current power contact 114 third, and the current power pin 108 electrically couples to the current power contact 116 fourth.

The sliding power contact 100 includes an arc suppressor 122 electrically coupled to the non-current power pin 106 and between the non-current power pin 106 and the current power pin 108. The arc suppressor 122 may be any suitable arc suppressor known or in the art or that may be developed, e.g., as disclosed in U.S. Pat. No. 8,619,395, TWO TERMINAL ARC SUPPRESSOR, Henke, filed Mar. 12, 2010, U.S. Pat. No. 9,423,442, ARC SUPPRESSOR, SYSTEM, AND METHOD, Henke, filed Sep. 27, 2013, U.S. Patent Application Publication No. 2014/0334050, PASSIVE ARC SUPPRESSOR, Henke, filed May 7, 2014, all of which are incorporated by reference herein in their entirety, as well as other arc suppressors incorporated by reference herein. The arc suppressor 122, in conjunction in various examples with the predetermined sequence of pins and contacts electrically coupling with one another disclosed above, may suppress arcing between the pins 106, 108, 110, 112 and contacts 114, 116, 118, 120, as disclosed in detail herein.

In such examples, ordinarily the arc suppressor 122 is in an open state and current does not flow between the non-current power pin 106 and non-current power contact 114. As such, current is left to flow over the current power pin 108 and current power contact 116 if in contact with one another or not flow if the current power pin 108 and current power contact 116 are not in contact with one another. However, if and when the current power pin 108 and current power contact 116 come into contact with one another an the conditions exist for arcing between the pin 108 and contact 116, then the arc suppressor 122 detects the condition for an arc and opens a path for current briefly to flow over the non-current path created by the non-current power pin 106 and non-current power contact 114. As such, it is to be recognized and understood that "non-current" for the purposes of this disclosure does not literally mean no current ever flows over such a non-current path created by the non-current pin 106, the non-current contact 114, and the arc suppressor 122. Rather, current rarely flows over the non-current path and, in various examples, only when the arc suppressor is relatively briefly shunting the current away from the current power pin 108 and current power contact 116 in the course of suppressing arcing.

For the purposes of this disclosure, it is to be recognized and understood that the term "length" does not necessarily mean an absolute length of the pins 106, 108, 110, 112 and contacts 114, 116, 118, 120, e.g., a distance from a first end 124 to a second end 126 of a pin 112. Rather, length may refer to an apparent length of the pins 106, 108, 110, 112 and contacts 114, 116, 118, 120. For instance, for the pins 106, 108, 110, 112, length may be an apparent length based on a distance to an edge 128 of the mobile load device connector 104 or, stated differently, a pin 106, 108, 110, 112 having the greatest distance from its second end 126 to the edge 128 may be considered to have the shortest length while the pin 106, 108, 110, 112 having the shortest distance from its second end 126 to the edge 128 may be considered to have the longest length.

FIGS. 2A-2F illustrate the predetermined sequence by which the pins 106, 108, 110, 112 electrically couple with their respective contact 114, 116, 118, 120 as the mobile load device contact 104 is inserted into the socket 102, in an example embodiment. While the predetermined sequence is illustrated with respect to the sliding power contact 100, it is to be recognized and understood that the principles disclosed herein may apply to any suitable sliding power contact, including sliding power contacts that do not have the same number of pins 106, 108, 110, 112 and contacts 114, 116, 118, 120 and/or the same illustrated configuration.

Figure 2A:
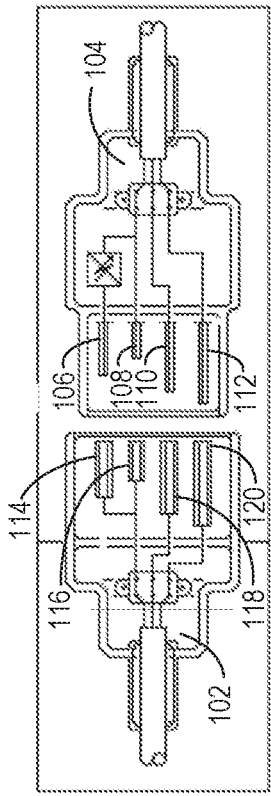
FIGS. 2A-2F illustrate the predetermined sequence by which pins electrically couple with their respective contact as a mobile load device contact is inserted into a socket, in an example embodiment.

FIG. 2A illustrates the sliding power contact 100 without any pins 106, 108, 110, 112 and contacts 114, 116, 118, 120 electrically coupled to one another.

Figure 2B:
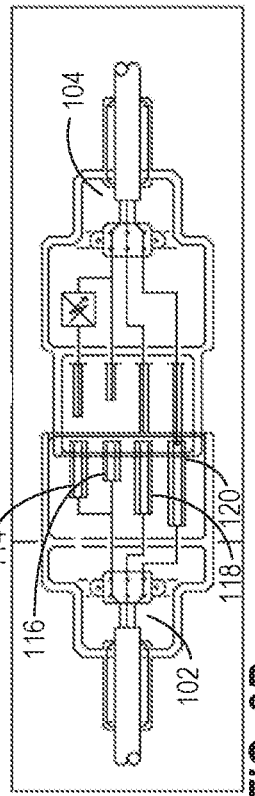

FIG. 2B illustrates the mobile load device contact 104 partially inserted into the socket 102 such that the ground pin 112 makes initial contact with the ground contact 120.

Figure 2C:
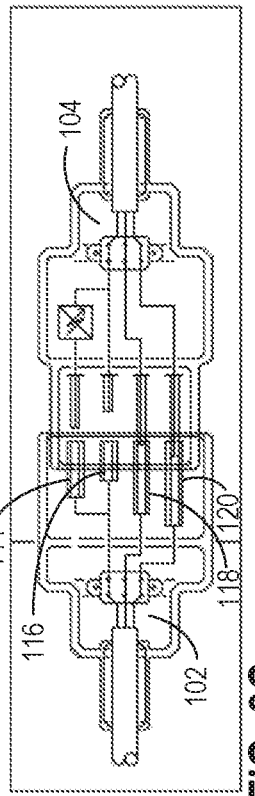

FIG. 2C illustrates the mobile load device contact 104 partially inserted into the socket 102 such that the neutral pin 110 makes initial contact with the neutral contact 118 while the ground pin 112 is further seated in the ground contact 120.

Figure 2D:
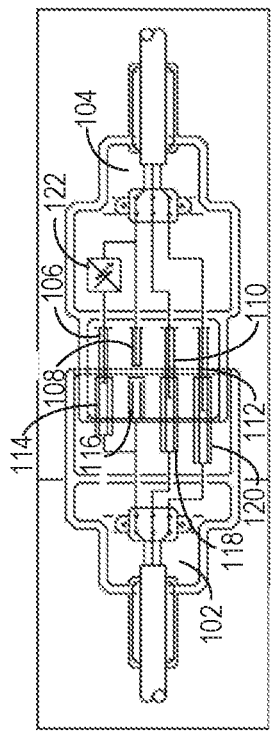

FIG. 2D illustrates the mobile load device contact 104 partially inserted into the socket 102 such that the non-current power pin 106 makes initial contact with the non-current power contact 112 and the neutral pin 110 and ground pin 12 are further seated in the neutral contact 118 and ground contact 120, respectively. The contacting of the non-current power pin 106 with the non-current power contact 112 electrically couples the arc suppressor 122 to the socket 102 generally.

Figure 2E:
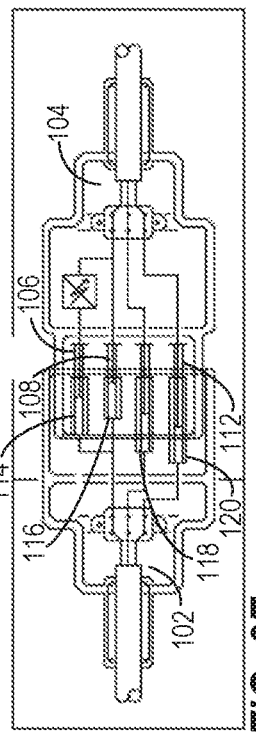

FIG. 2E illustrates the mobile load device contact 104 partially inserted into the socket 102 such that the current power pin 108 makes initial contact with the current power contact 116, while the non-current power pin 106, neutral pin 110, and ground pin 112 are further seated in the non-current power contact 114, the neutral contact 118, and ground contact 120, respectively. Owing to the arc suppressor 122 already having been coupled via the non-current power pin 106 and contact 114, the arc suppressor 122 suppresses any arcing that might tend to occur between the current power pin 108 and current power contact 116 as those components draw near to one another and eventually contact one another.

Figure 2F:
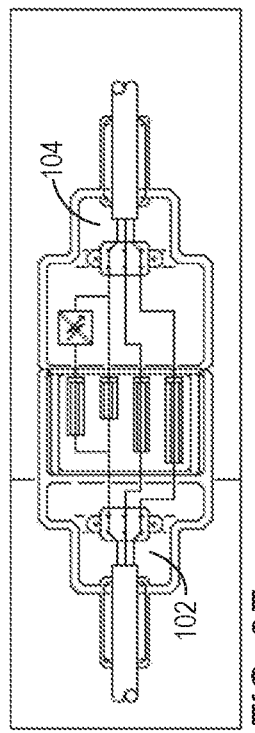

FIG. 2F illustrates the mobile load device contact 104 fully inserted into the socket 102.

It is to be recognized and understood that withdrawing the mobile load device contact 104 from the socket 102 repeats the predetermined sequence in reverse, with each step defining a breaking of the pin 106, 108, 110, 112 from its respective contact 114, 116, 118, 120 and with the arc suppressor 122 suppressing the arc that would be expected to result from the breaking of the current power pin 108 from the current power contact 116.

Figure 3A:
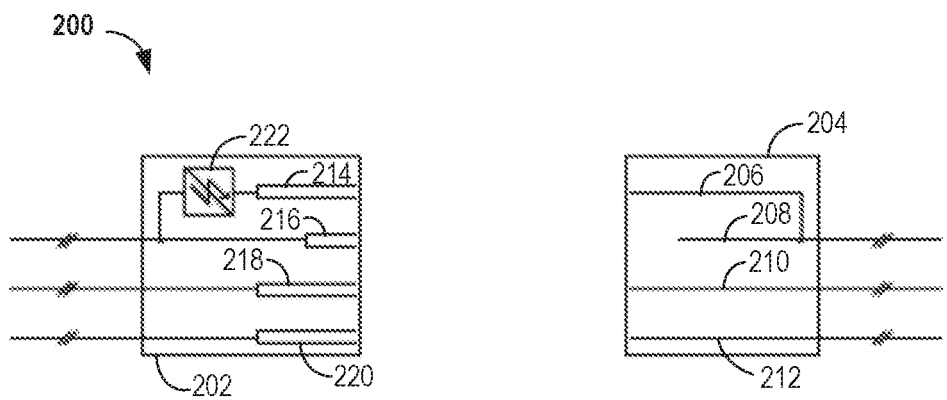
FIGS. 3A-3C are an abstract illustration of the predetermined sequence with an electrically generic circuit diagram, in an example embodiment.
Figure 3B:
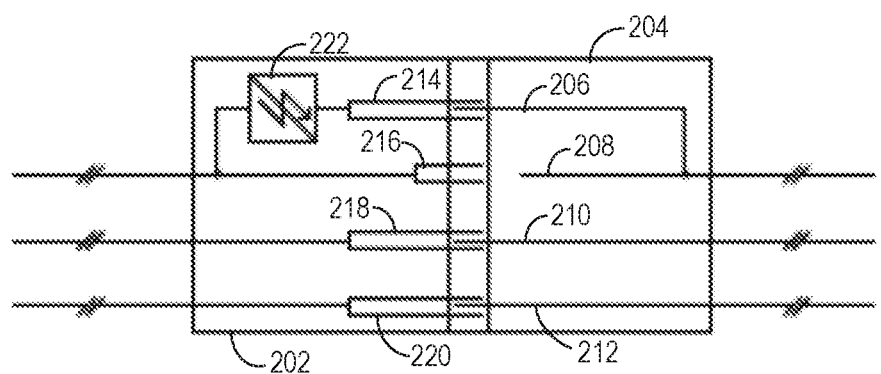
Figure 3C:
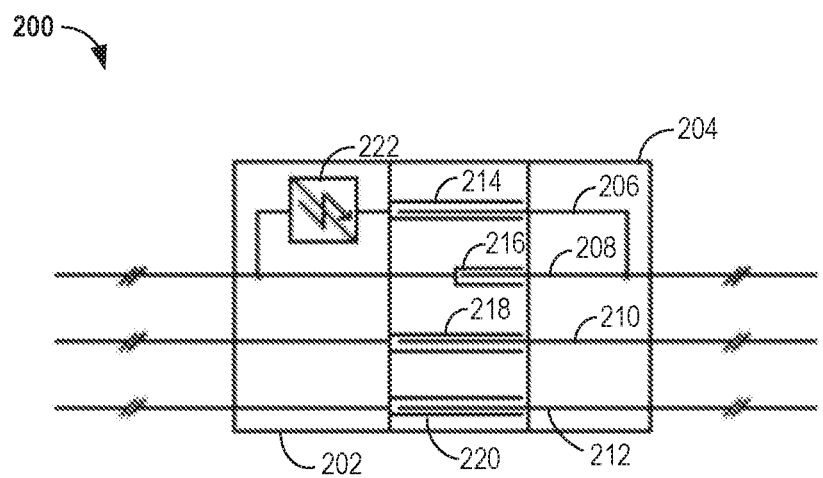

FIGS. 3A-3C are an abstract illustration of the predetermined sequence with an electrically generic circuit diagram, in an example embodiment. For the purposes of this discussion, the generic circuit diagram will be described with respect to a sliding power contact 200. However, as will be described in detail below, the generic circuit diagram may describe any situation in which two contacts, wires, electrodes, or any other suitable electronic component or article slide in contact with one another, such as with a commutator in a motor or catenary system or chafing wiring.

The sliding power contact 200 includes a socket 202 and a mobile load device connector 204. The mobile load device connector 204 includes a non-current power pin 206, a current power pin 208, a neutral pin 210, and a ground pin 212. The socket 202 includes a non-current power contact 214 configured to engage and electrically couple with the non-current power pin 206, a current power contact 216 configured to engage and electrically couple with the current power pin 208, a neutral contact 218 configured to engage and electrically couple with the neutral pin 210, and a ground contact 220 configured to engage and electrically couple with the ground pin 212.

The predetermined sequence for the sliding power contact 200 is similar to and operates under the same principles as the predetermined sequence applying to the sliding power contact 100, with two implementational differences. First, the arc suppressor 222 is a component of the socket 202 rather than the mobile load device connector 204. As such, the arc suppressor 222 is directly coupled to the non-current power contact 216 and, when the sliding power contact 200 is coupled together, creates a non-current path with the non-current power contact 214 and the non-current pin 206.

Second, the non-current power pin 206, the neutral pin 210, and the ground pin 212 have a first length that is approximately the same length while the current power pin 208 has a second length shorter than the first length. For the purposes of this disclosure, the first length between and among the non-current power pin 206, the neutral pin 210, and the ground pin 212 may vary by several percent but may be considered approximately the same length nonetheless provided that all of the non-current power pin 206, the neutral pin 210, and the ground pin 212 contact their respective contacts 214, 218, 220 before the current power pin 208 contacts the current power contact 216. Consequently, the predetermined sequence involves the simultaneous or near-simultaneous contacting of the non-current power pin 206, the neutral pin 210, and the ground pin 212 contact their respective contacts 214, 218, 220 followed by the contacting of the current power pin 208 with the current power contact 216.

FIG. 3A illustrates the sliding power contact 200 in a disconnected configuration.

FIG. 3B illustrates the sliding power contact 200 in an initial connected configuration. In the initial connected configuration, the non-current power pin 206, the neutral pin 210, and the ground pin 212 are in contact with their respective contacts 214, 218, 220 while the current power pin 208 is not in contact with the current power contact 216. The arc suppressor 222 is thereby electrically coupled over the non-current power pin 206 and the non-current power contact 214, and is prepared to suppress arcing upon the current power pin 208 contacting the current power contact 214.

FIG. 3C illustrates the sliding power contact 200 in a fully connected configuration. All of the pins 206, 208, 210, 212 are connected to their respective contacts 214, 216, 218, 220. The previous inclusion of the arc suppressor 222 into the system suppresses any arcing that may have occurred between the current power pin 208 contacting the current power contact 214.

As with the predetermined sequence for the sliding power contact 100, it is to be recognized and understood that withdrawing the mobile load device contact 204 from the socket 202 repeats the predetermined sequence in reverse, with each step defining a breaking of the pin 206, 208, 210, 212 from its respective contact 214, 216, 218, 220, and with the arc suppressor 222 suppressing the arc that would be expected to result from the breaking of the current power pin 208 from the current power contact 216.

While the arc suppressors 122, 222 are disclosed as being located in a single location, it is to be recognized and understood that in each of the sliding power contacts 100, 200, the arc suppressor 122, 222 may be located in either the socket 102, 202, or the mobile load device connector 104, 204, or both, e.g., a separate arc suppressor 122, 222 may be implemented in both the socket 102, 202, and the mobile load device connector 104, 204. Moreover, components of a single arc suppressor 122, 222 may be split between the socket 102, 202 and the mobile load device connector 104, 204, with the connecting of the non-current power pin 206 to the non-current power connector 214 causing the components of the arc suppressor 122, 222 to be electrically coupled to one another and form the functional arc suppressor 122, 222 upon the coupling of the non-current power pin 206 to the non-current power connector 214

While pins 106, 108, 110, 112, 206, 208, 210, 212 and contacts 114, 116, 118, 120, 214, 216, 218, 220 are described herein, it is to be recognized and understood that any situation in which contacts slide with respect to one another may create the circumstances for arcing and may be electrically represented in the same manner as the sliding power contacts 100, 200. Thus, principles disclosed with respect to the sliding power contacts 100, 200 may be applied to any of a variety of other circumstances that do not only involve pins and contacts. For instance, a catenary or overhead wire system includes a charged contact wire and a current collector placed, e.g., on the top of a train and pressed against and slides along the charged contact wire. A third-rail train includes a charged contact rail and a current collector placed against the charged contact rail. In various examples, such a system may incorporate a commutator to make the connection with the charged contact wire, or the charged contact more generally. Additional uses of a commutator include as a rotating sliding power contact that may provide electrical continuity and conductivity between a motor/generator stator and a motor/generator rotor. For the purposes of equating the additional systems to the existing labels of FIGS. 3A-3C, a charged contact, such as a charged contact wire or charged contact rail, may be considered equivalent to a current power contact 116 while, e.g., a current collector or commutator may be considered equivalent to the current power pin 108.

In such an example, as an electrical circuit, the commutator may have the same electrical function as the mobile load device connector 204 and the stator and/or rotor may have the same electrical function as the socket 202, or vice versa. By incorporating a non-current power line that is coupled to an arc suppressor 222 and which is configured to provide an electrical connection between the commutator and the stator and/or rotor before the current power line makes contact, arcing may be suppressed during the operation of the motor or catenary line, as the case may be. Thus, the diagrams of FIGS. 3A-3C, while specifically drawn to a sliding power contact, may be understood to be electrically relevant to any situation with power contacts that slide with respect to one another. In circumstances with a commutator, brush motor, or other high speed rotational contact, a high speed arc suppressor as incorporated by reference herein may be utilized.

Similarly, wires that chafe and wear through insulation may create sliding contacts that may be susceptible to arcing. For instance, in a circumstance in which two wires rub against one another and wear away their insulation at the point of contact, eventually the bare wires may come into contact in a sliding relationship and cause arcing. In such an example, either as protection against arcing or as a wire chafing detector, an arc suppressor 222 may be coupled as part of a non-current power line between the two wires prior to chafing, e.g., at the time of installation.

Once mechanical motion has worn through both insulations, thereby exposing the bare conductor on either side, an unintentional contact is created which follows the same physics, rules and principals than any other intentional contact consisting of two opposing electrodes during which, when connected, a current flows. When the two exposed wire conductors make unintentional contact, an arc may be created. In such an example, one wire may be electrically the same as the current power pin 208 and the other wire may be electrically the same as the current power contact 216. In such an example, the inclusion of the arc suppressor 222 in parallel with the wires may create a non-current path between the wires which would provide arc suppression in the event that the wires chafed and eventually contacted one another.

Moreover, given that the arc suppressor 222 may include visual or signal outputs to indicate that arcing has occurred, the inclusion of the arc suppressor 222 may provide for chafing detection. As the arc suppressor 222 in such a circumstance would only suppress an arc following chafing between the wires, the occurrence of the arc suppressor 222 indicating that an arc had been suppressed could be identified as an indication that the wires had chafed and shorted together. Thus, it is to be recognized and understood that the non-current path may be effectively permanent or at least resilient while the current path may be created following the wires chafing and shorting together.

ADDITIONAL EXAMPLES

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Example 1 is an arc suppressing circuit configured to suppress arcing across a power contactor coupled to an alternating current (AC) power source having a predetermined number of phases, each contact of the power contactor corresponding to one of the predetermined number of phases, the arc suppressing circuit comprising: a number of dual unidirectional arc suppressors equal to the predetermined number of phases of the AC power source, each dual unidirectional arc suppressor coupled across the power contactor, each dual unidirectional arc suppressor comprising: a first phase-specific arc suppressor configured to suppress arcing across the associated contacts in a positive domain; a second phase-specific arc suppressor configured to suppress arcing across the associated contacts in a negative domain; and a coil lock controller, configured to be coupled between a contact coil driver of the power contactor, configured to detect an output condition from the contact coil driver and inhibit operation of the first and second phase-specific arc suppressors over a predetermined time.

In Example 2, the subject matter of Example 1 includes, wherein the first phase-specific arc suppressor is configured to not suppress arcing in the negative domain and the second phase-specific arc suppressor is configured to not suppress arcing in the positive domain.

In Example 3, the subject matter of any one or more of Examples 1 and 2 includes, wherein each of the first and second phase-specific arc suppressors comprise a latching switch configured to cause the first and second phase-specific arc suppressors to not suppress arcing in the negative and positive domains, respectively.

In Example 4, the subject matter of any one or more of Examples 1-3 includes, wherein the latching switch is a thyristor.

In Example 5, the subject matter of any one or more of Examples 1-4 includes, wherein the coil lock controller comprises: a power converter coupled over a coil interface; a rectifier coupled to the power converter; a power limiter coupled to the rectifier; a power storage coupled to the power limiter; and a current supply coupled to the power storage, the current supply coupled to the first phase-specific arc suppressor and the second phase-specific arc suppressor.

In Example 6, the subject matter of any one or more of Examples 1-5 includes, wherein the power converter comprises an RC circuit, the rectifier comprises a diode array, the power limiter comprises a Zener diode; the power storage comprises a capacitor; and the current supply comprises a MOSFET transistor.

In Example 7, the subject matter of any one or more of Examples 1-6 includes, wherein each of the first and second phase-specific arc suppressors comprise a coil lock, coupled to the coil lock controller, configured to disable a respective one of the first and second phase-specific arc suppressors based on an input from the coil lock controller.

In Example 8, the subject matter of any one or more of Examples 1-7 includes, wherein the coil lock comprises a signal isolator emitter coupled to the coil lock controller and a signal isolator detector coupled to the latching switch.

In Example 9, the subject matter of Example 8 includes, wherein the coil lock is a photorelay comprising the signal isolator emitter and the signal isolator detector.

In Example 10, the subject matter of any one or more of Examples 1-9 includes, wherein each of the first and second phase-specific arc suppressors comprises: a signal edge detector; an edge-pulse converter in series with the signal edge detector; a current limiter in series with the edge-pulse converter; and a first over voltage protection coupled to the edge-pulse converter and the signal isolator detector of the coil lock.

In Example 11, the subject matter of any one or more of Examples 1-10 includes, wherein the edge-pulse converter is at least one of: a transformer; a pulse transformer; or a gate trigger.

In Example 12, the subject matter of any one or more of Examples 1-11 includes, wherein each of the dual unidirectional arc suppressors further comprises: a first contact terminal configured to be electrically coupled to a first contact of the power contactor; a second contact terminal configured to be coupled to be electrically coupled to a second contact of the power contactor, the second contact terminal coupled to the first phase-specific arc suppressor, the second phase-specific arc suppressor, and the coil lock controller; and a fusible element coupled between the first contact terminal and the first phase-specific arc suppressor, the second phase-specific arc suppressor, and the coil lock controller.

In Example 13, the subject matter of any one or more of Examples 1-12 includes, wherein the fusible element is one of: a solder mask, a silkscreen, a passive fuse, or an active fuse.

In Example 14, the subject matter of any one or more of Examples 1-13 includes, wherein each of the dual unidirectional arc suppressors further comprises a second over voltage protector coupled over the first phase-specific arc suppressor, the second phase-specific arc suppressor, and the coil lock controller.

In Example 15, the subject matter of any one or more of Examples 1-14 includes, wherein the second over voltage protector comprises at least one of: variostor, a transient-voltage suppression (TVS) diode, a Zener diode, a gas tube, or a spark gap.

Example 16 is a three-phase arc suppressing circuit, comprising: a coil interface, configured to be coupled to a contactor coil driver of a power contactor and to receive an output condition of the contactor coil driver and output a signal based on the output condition; a first dual unidirectional arc suppressor configured to be coupled to contacts at a first phase, comprising: a first phase-specific arc suppressor configured to suppress arcing in a positive domain; a second phase-specific arc suppressor configured to suppress arcing in a negative domain; and a coil lock controller, coupled to the coil interface, configured to inhibit operation of the first and second phase-specific arc suppressors over a predetermined time based on the signal from the coil interface; a second dual unidirectional arc suppressor configured to be coupled to contacts at a second phase one hundred and twenty degrees greater than the first phase, comprising: a first phase-specific arc suppressor configured to suppress arcing in the positive domain; a second phase-specific arc suppressor configured to suppress arcing in the negative domain; and a coil lock controller, coupled to the coil interface, configured to inhibit operation of the first and second phase-specific arc suppressors over a predetermined time based on the signal from the coil interface; and a third dual unidirectional arc suppressor configured to be coupled to contacts at a third phase one hundred and twenty degrees less than the first phase, comprising: a first phase-specific arc suppressor configured to suppress arcing in the positive domain; a second phase-specific arc suppressor configured to suppress arcing in the negative domain; and a coil lock controller, coupled to the coil interface, configured to inhibit operation of the first and second phase-specific arc suppressors over a predetermined time based on the signal from the coil interface.

In Example 17, the subject matter of Example 16 includes, wherein the predetermined time is selected to allow the contactor coil driver to de-energize and allow time for the power contactor to break or make contact.

In Example 18, the subject matter of any one or more of Examples 16 and 17 includes, wherein the first phase-specific arc suppressors are configured to not suppress arcing in the negative domain and the second phase-specific arc suppressor is configured to not suppress arcing in the positive domain.

In Example 19, the subject matter of any one or more of Examples 16-18 includes, wherein each of the first and second phase-specific arc suppressors comprise a latching switch configured to cause the first and second phase-specific arc suppressors to not suppress arcing in the negative and positive domains, respectively.

In Example 20, the subject matter of any one or more of Examples 16-19 includes, wherein the latching switch is a thyristor.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A sliding power contact, comprising:
    a mobile load device connector, comprising:
        a non-current power pin having a first length;
        a current power pin having a second length less than the first length;
        a neutral pin; and
        a ground pin;
    a socket, configured to accept the mobile load device connector, comprising:
        a non-current power contact configured to electrically couple with the non-current power pin;
        a current power contact configured to electrically couple with the current power pin;
        a neutral contact configured to electrically couple with the neutral pin; and
        a ground contact configured to electrically couple with the ground pin; and
    an arc suppressor directly coupled to at least one of the non-current power pin and the non-current power contact, wherein the arc suppressor, the non-current power pin, and the non-current power contact form a current path between the current power pin and the current power contact when the non-current power pin is in contact with the non-current power contact and the current power pin is not in contact with the current power contact;
    wherein the first length and the second length cause the non-current power pin and the current power pin to contact the non-current power contact and the current power contact, respectively, according to a predetermined sequence when the mobile load device connector is inserted into the socket that causes the arc suppressor to suppress arcing between the current power pin and the current power contact.

2. The sliding power contact of claim 1, wherein the neutral pin has a third length longer than the first length.

3. The sliding power contact of claim 2, wherein the ground pin has a fourth length longer than the third length.

4. The sliding power contact of claim 3, wherein the arc suppressor is a component of the mobile load device connector.

5. The sliding power contact of claim 3, wherein the arc suppressor is a component of the socket.

6. The sliding power contact of claim 3, wherein the arc suppressor is a component of both the mobile load device connector and the socket.

7. A method of suppressing arcing in a sliding contact, comprising:
  forming a first current path between a non-current power contact and a non-current power pin, the path including an arc suppressor; then
  forming a second current path between a current power contact and a current power pin, wherein the arc suppressor suppresses arcing between the current power contact and the current power pin and between the non-current power contact and the non-current power pin.

8. The method of claim 7, further comprising, following forming the second current path between the current power contact and the current power pin, causing, with the arc suppressor, current to flow over the first current path between the non-current power contact and the non-current power pin until arcing between the current power contact and the current power pin has been suppressed.

9. The method of claim 8, further comprising, prior to forming the first current path between the non-current power contact and a non-current power pin, electrically coupling a neutral pin to a neutral contact.

10. The method of claim 9, further comprising, prior to forming the first current path between the non-current power contact and a non-current power pin, electrically coupling a ground pin to a ground contact.

11. The method of claim 10, wherein electrically coupling the ground pin to the ground contact occurs before electrically coupling the neutral pin to the neutral contact.

12. The method of claim 8, wherein the current power contact is a charged contact and the current power pin is a current collector, and wherein forming the second current path between the current power contact and the current power pin comprises touching a charge collector to the charged contact.

13. The method of claim 12, wherein the charge collector is a commutator and touching the commutator to the charged contact includes rolling the commutator along the charged contact.

14. The method of claim 13, wherein the charged contact is a catenary wire.

15. A method of making a sliding power contact, comprising:
  obtaining a mobile load device connector, comprising:
    a non-current power pin having a first length;
    a current power pin having a second length less than the first length;
    a neutral pin; and
    a ground pin;
  obtaining a socket, configured to accept the mobile load device connector, comprising:
    a non-current power contact configured to electrically couple with the non-current power pin;
    a current power contact configured to electrically couple with the current power pin;
    a neutral contact configured to electrically couple with the neutral pin; and
    a ground pin configured to electrically couple with the ground pin; and
  directly coupling an arc suppressor to at least one of the non-current power pin and the non-current power contact, wherein the arc suppressor, the non-current power pin and the non-current power contact form a current path between the current power pin and the current power contact when the non-current power pin is in contact with the non-current power contact and the current power pin is not in contact with the current power contact;
  wherein the first length and the second length cause the non-current power pin and the current power pin to contact the non-current power contact and the current power contact, respectively, according to a predetermined sequence when the mobile load device connector is inserted into the socket that causes the arc suppressor to suppress arcing between the current power pin and the current power contact.

16. The method of claim 15, wherein the neutral pin has a third length longer than the first length.

17. The method of claim 16, wherein the ground pin has a fourth length longer than the third length.

18. The method of claim 17, wherein directly coupling the arc suppressor includes directly coupling the arc suppressor to the mobile load device connector.

19. The method of claim 17, wherein directly coupling the arc suppressor includes directly coupling the arc suppressor to the socket.

20. The method of claim 17, wherein directly coupling the arc suppressor includes directly coupling the arc suppressor to both the mobile load device connector and the socket.

* * * * *